US007545014B2

(12) United States Patent
Wang et al.

(10) Patent No.: US 7,545,014 B2
(45) Date of Patent: Jun. 9, 2009

(54) THREE-DIMENSIONAL RESONANT CELLS WITH TILT UP FABRICATION

(75) Inventors: Shih-Yuan Wang, Palo Alto, CA (US); Alexandre Bratkovski, Palo Alto, CA (US); Wei Wu, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 174 days.

(21) Appl. No.: 11/580,385

(22) Filed: Oct. 12, 2006

(65) Prior Publication Data

US 2008/0087973 A1 Apr. 17, 2008

(51) Int. Cl.
*H01L 31/00* (2006.01)

(52) U.S. Cl. .............................. 257/443; 257/E31.121; 359/299

(58) Field of Classification Search ................... 438/10, 438/57, 73, 74, FOR. 137; 333/99, 219, 333/919; 343/911 R, 700 MS; 29/417, 602.1, 29/846; 427/128, 209; 336/223; 257/431, 257/443, 459, E31.041, E31.11, E31.121, 257/E31.119, E31.123; 359/244, 299
See application file for complete search history.

(56) References Cited

U.S. PATENT DOCUMENTS 6,147,582 A 11/2000 Goldsmith et al.
6,245,444 B1 6/2001 Marcus et al.
6,498,870 B1 12/2002 Wu et al.
6,757,093 B2 6/2004 Wood et al.
6,791,432 B2 * 9/2004 Smith et al. ................ 333/99 S
6,922,127 B2 7/2005 Zou et al.
6,938,325 B2 9/2005 Tanielian
7,015,865 B2 * 3/2006 Isaacs et al. ................ 343/757
2005/0021247 A1 * 1/2005 Liu et al. ....................... 702/42
2005/0159002 A1 7/2005 Fork et al.
2005/0272179 A1 12/2005 Frauenglass
2006/0044212 A1 * 3/2006 Wang et al. ............. 343/911 R
2007/0234793 A1 * 10/2007 Liu et al. ....................... 73/198
2008/0165079 A1 * 7/2008 Smith et al. ............. 343/911 R
2009/0009853 A1 * 1/2009 Tonucci ...................... 359/298

FOREIGN PATENT DOCUMENTS

WO WO2006023195 A2 3/2006

OTHER PUBLICATIONS

Jaksic et al. "Negative Refractive Index Metamaterials: Principles and Applications", Jun. 2006, Microwaver Review, vol. 12, No. 1, pp. 36-49.*

(Continued)

*Primary Examiner*—W. David Coleman
*Assistant Examiner*—Joseph C Nicely

(57) ABSTRACT

A composite material for providing at least one of a negative effective permeability and a negative effective permittivity for incident radiation of at least one wavelength is described. The composite material comprises a plurality of three-dimensional resonant cells disposed across a first substrate. Each three-dimensional resonant cell comprises a base substantially parallel to the substrate and at least three sidewalls upwardly extending therefrom. Each upwardly extending sidewall comprises a sidewall substrate having at least one conductor patterned thereon. Each upwardly extending sidewall is fabricated by forming the sidewall substrate as a substantially horizontal layer above the first substrate, lithographically patterning the sidewall substrate with the at least one conductor while horizontally disposed above the first substrate, and tilting up the sidewall substrate to the upwardly extending position.

14 Claims, 5 Drawing Sheets

OTHER PUBLICATIONS

Poman, P.m. et al. "Modeling of Metamaterials With Negative Refractive Index using 2-D Shunt and 3-D SCN TLM Networks" IEEE Transactions on Microwave Theory and Techniques, vol. 53, No. 4, Apr. 2005, pp. 1496-1505.*

Koschny Th. et al. "Isotropic three-dimensional left-handed metamaterials" Physical Review B, vol. 71, pp. 121103-1 to 121103-4.*

Iyer Ashwin K. et al. "A three-dimensional isotropic transmission-line metamaterial topology for free-space excitation" Applied Physics Letters vol. 92, Jul. 2008, pp. 134701-1 to 137401-4.*

Houck Andrew A. et al. "Experimental Observations of a Left-Handed Mataerial That Obeys Snell's Law" Physical Review Letters, vol. 90, No. 13, Apr. 2003, pp. 261106-1 to 261106-4.*

Kaajakari, V., et. al., Electrostatic batch assembly . . . using ultrasonic triboelectricity, 14th IEEE Intl. MEMS Conf.,ISBN: 0-7803-5998-4, pp. 10-13 (2001).

Boustedt, K., et. al., Flip chip as enabler for MEMS packaging, IEEE Elect. Comp. and Tech. Conf., ISBN: 07803-7430-4, pp. 124-128 (2002).

Lin, Y., et. al., Design and assembly of surface-micromachined opt. switch for opt. add/drop multiplexer app., IEEE Trans. on Adv. Pkg., vol. 26, No. 3 pp. 261-267 (Aug. 2003).

Hong, Y., et. al., Design, fabrication and test of self-assembled optical corner cube reflectors, Journal of Micromech. Micoreng., pp. 663-672 (2005).

Johnson, R., "Magnetic actuation enables three-dimensional MEMS," EETimes, downloaded on Sep. 26, 2006 from http://www.eetimes.com/story/OEG20000515S0049.

Reid, J., et. al., "Automated assembly of flip-up micromirrors," Transducers '97, 2A2.08P, Intl. Conf. Sol.-State Sensors Actuators, pp. 347-350 (1997).

Comtois, J., et. al., Fab. micro-instruments in surface-micromachined polycrystalline silicon, Proc. 43rd Intl. Instr. Symp., Inst. Society of America, pp. 169-179 (1997).

Fleischmann, T., et. al., "Self-assembling GaAs mirror with electrostatic actuation using micro-origami," Physica E 24, pp. 78-81 (2004).

Liu, Y., et. al., "Micro-origami: fabrication of self-folding microstructures," Downloaded on Oct. 11, 2006 from http://www.enme.umd.edu/news/November01/micro-origami.pdf.

Jurga, S.M., et. al., "3D Nanomanufacturing via Folding of 2D Membranes," 2003 Mat. Research at MIT, downloaded Oct. 11, 2006 http://mpc-web.mit.edu/about_mpc/ar2003/barbast.pdf.

In, H., et. al., "Nanostructured origami 3D fab. and assembly electrochemical energy storage devices," 5th IEEE Conf. Nanotechnology Proceedings, (2005).

Jurga, S., et. al., "Nanostructured Origami," 3rd IEEE Conference on Nanotechnology, ISBN: 0-7803-7976-4, pp. 220-223 (Aug. 2003).

Chen, J., et. al., "Dev. of MEMS vert. planar coil inductors . . . plastic deform. mag. assembly (PDMA)," downloaded on Oct. 11, 2006 from http://www.nsti.org/publ/MSM2002/287.pdf.

* cited by examiner

THREE-DIMENSIONAL RESONANT CELLS WITH TILT UP FABRICATION

FIELD

This patent specification relates generally to the propagation of electromagnetic radiation and, more particularly, to composite materials capable of exhibiting negative effective permeability and/or negative effective permittivity with respect to incident electromagnetic radiation.

BACKGROUND

Substantial attention has been directed in recent years toward composite materials capable of exhibiting negative effective permeability and/or negative effective permittivity with respect to incident electromagnetic radiation. Such materials, often interchangeably termed artificial materials or metamaterials, generally comprise periodic arrays of electromagnetically resonant cells that are of substantially small dimension (e.g., one-fifth or less) compared to the wavelength of the incident radiation. Although the individual response of any particular cell to an incident wavefront can be quite complicated, the aggregate response the resonant cells can be described macroscopically, as if the composite material were a continuous material, except that the permeability term is replaced by an effective permeability and the permittivity term is replaced by an effective permittivity. However, unlike continuous materials, the resonant cells have structures that can be manipulated to vary their magnetic and electrical properties, such that different ranges of effective permeability and/or effective permittivity can be achieved across various useful radiation wavelengths.

Of particular appeal are so-called negative index materials, often interchangeably termed left-handed materials or negatively refractive materials, in which the effective permeability and effective permittivity are simultaneously negative for one or more wavelengths depending on the size, structure, and arrangement of the resonant cells. Potential industrial applicabilities for negative-index materials include so-called superlenses having the ability to image far below the diffraction limit to $\lambda/6$ and beyond, new designs for airborne radar, high resolution nuclear magnetic resonance (NMR) systems for medical imaging, microwave lenses, and other radiation processing devices.

One issue that arises in the realization of useful devices from such composite materials, including negative index materials, relates to isotropy of response and amenability to large scale fabrication processes. For example, dense planar arrays of two-dimensional resonant cells having electrical conductors parallel to a substrate are generally amenable to large scale lithographic fabrication processes. However, their response can be anisotropic because, for example, resonance for the magnetic field is favored for magnetic field vectors normal to the plane of the substrate and resonance for the electric field is favored for electrical field vectors parallel to the plane of the substrate. On the other hand, composite materials having three-dimensional resonant cells in which there are electrical conductors for each of three orthogonal planes can provide increased isotropy of response, but are substantially more difficult to fabricate on a large scale than composite materials having planar arrays of two-dimensional resonant cells.

Another issue that arises relates to wavelengths of operation and isotropy of response, with three-dimensional resonant cells being difficult to fabricate for smaller wavelengths such as those in the infrared and optical regimes. It would be desirable to provide a composite material that is amenable to large scale fabrication processes while also having increased isotropy of response. It would be further desirable to provide such composite material that can be operable for smaller wavelengths such as those in the infrared and optical regimes. Other issues arise as would be apparent to one skilled in the art in view of the present disclosure.

SUMMARY

In one embodiment, a composite material for providing at least one of a negative effective permeability and a negative effective permittivity for incident radiation of at least one wavelength is provided. The composite material comprises a plurality of three-dimensional resonant cells disposed across a first substrate. Each three-dimensional resonant cell comprises a base substantially parallel to the substrate and at least three sidewalls upwardly extending therefrom. Each upwardly extending sidewall comprising a sidewall substrate having at least one conductor patterned thereon. Each upwardly extending sidewall is fabricated by forming the sidewall substrate as a substantially horizontal layer above the first substrate, lithographically patterning the sidewall substrate with the at least one conductor while horizontally disposed above the first substrate, and tilting up the sidewall substrate to the upwardly extending position.

Also provided is a method for fabricating a composite material having a plurality of three-dimensional resonant cells disposed across a substrate for providing at least one of a negative effective permeability and a negative effective permittivity for incident radiation of at least one wavelength. The method comprises, for each of the three-dimensional resonant cells, forming at least three support members above the substrate, each support member being horizontally oriented and laterally disposed around a base region for that three-dimensional resonant cell. The method further comprises lithographically forming at least one electromagnetically reactive pattern of conductor material having a major dimension not larger than about one-fifth of the wavelength on each of the horizontally oriented support members. The method further comprises, for each of the three-dimensional resonant cells, tilting up each of the support members from their horizontal orientations inward toward the base region to form the three-dimensional resonant cell.

Also provided is a method for propagating electromagnetic radiation at an operating wavelength, comprising placing a composite material in the path of the electromagnetic radiation, the composite material having a plurality of three-dimensional resonant cells disposed across a first substrate. Each three-dimensional resonant cell comprises a base substantially parallel to the substrate and at least three sidewalls upwardly extending therefrom. Each upwardly extending sidewall comprises a sidewall substrate having at least one electromagnetically reactive pattern of conductor material, the pattern having a major dimension not larger than about one-fifth of the operating wavelength. Each upwardly extending sidewall is fabricated by forming the sidewall substrate as a substantially horizontal layer above the first substrate, lithographically patterning the sidewall substrate with the electromagnetically reactive pattern of conductor material while horizontally disposed above the first substrate, and tilting up the sidewall substrate to the upwardly extending position.

DETAILED DESCRIPTION

Figure 1A:
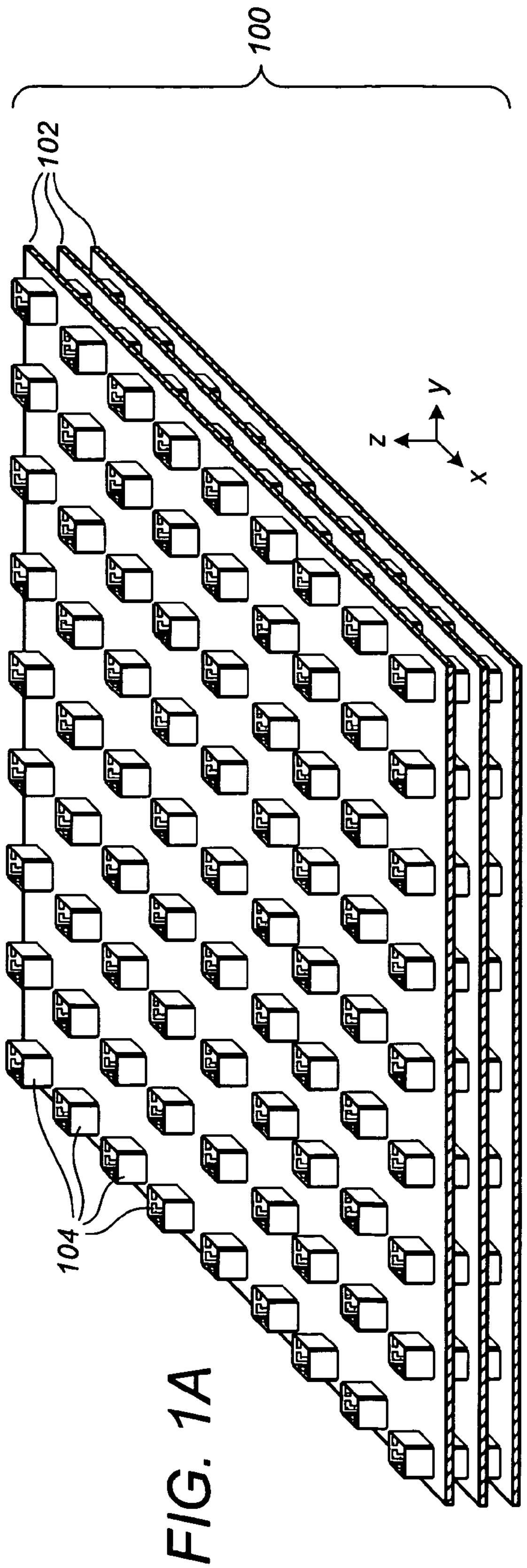
FIGS. 1A-1C illustrate perspective views of a composite material and a three-dimensional resonant cell according to an embodiment.
Figure 1B:
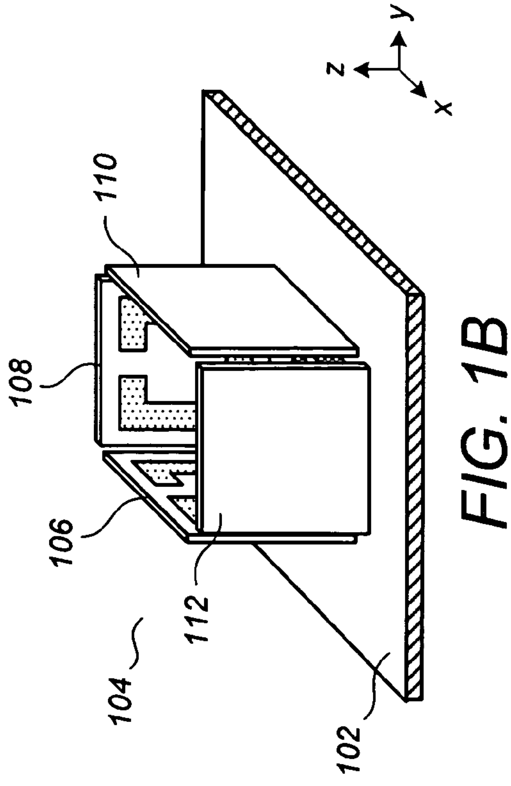

FIG. 1A illustrates a composite material 100 according to an embodiment, comprising a plurality of vertically-stacked substrates 102, each substrate 102 comprising an array of three-dimensional resonant cells 104. FIG. 1B illustrates a perspective view of one of the three-dimensional resonant cells 104, comprising four sidewalls 106, 108, 110, and 112. While several of the embodiments are described in the context of a particular three-dimensional resonant cell that has an open top and four vertical sidewalls, it is to be appreciated that a variety of different three-dimensional resonant cells having three or more sidewalls at various upward tilting angles are within the scope of the present teachings.

Figure 1C:
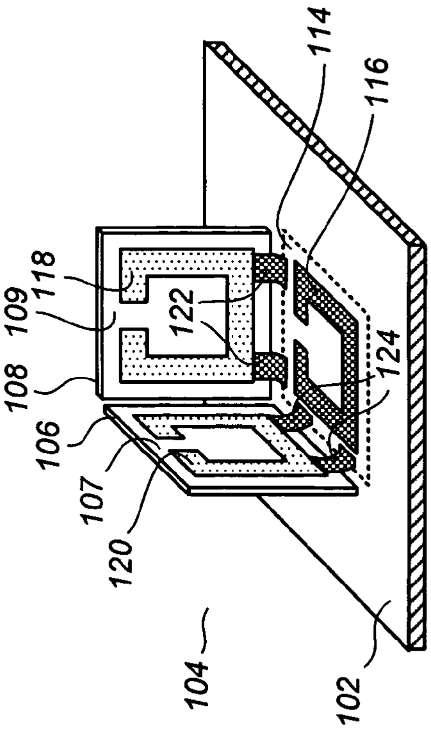

FIG. 1C illustrates a perspective view of the three-dimensional resonant cell 104 with the sidewalls 110 and 112 omitted for clarity of presentation. The three-dimensional resonant cell 104 further comprises a base 114 that may be integral with the substrate 102. A lateral outline of the base 114 is generally defined by the locations of the sidewalls 106, 108, 110, and 112. Each of the sidewalls 106, 108, 110, and 112 comprises a main support member, termed herein a sidewall substrate, that is initially formed horizontally above the substrate 102 and then tilted up to an upwardly extending position thereafter. Shown in the example of FIG. 1C are sidewall substrates 107 and 109 for the sidewalls 106 and 108, respectively. Preferably, the base 114 and the sidewall substrates 107 and 109 each comprise at least one conductor lithographically patterned thereon. For the embodiment of FIG. 1C, a square slotted-ring resonator 116 is patterned on the base 114, a square slotted-ring resonator 120 is patterned on the sidewall substrate 107, and a square slotted-ring resonator 118 is patterned on the sidewall substrate 109.

Associated with sidewall 108 is a pair of bendable joining elements 122 that attach the sidewall substrate 109 to the substrate 102 and/or base 114 as shown. The bendable joining elements 122 are preferably formed while the sidewall substrate 109 is horizontally disposed relative to the substrate 102. The bendable joining elements 122 are flexible enough to bend during device fabrication while the sidewall substrate 109 is being upwardly tilted to a vertical position, but stiff enough to maintain the sidewall substrate 109 in the vertical position thereafter. Also shown in FIG. 1C are similar bendable joining elements 124 for the sidewall 106.

By way of example and not by way of limitation, the composite material 102 may be designed to exhibit at least one of a negative effective permeability and a negative effective permittivity for incident radiation at an operating wavelength of about 200 μm in the microwave regime. For this wavelength, the size of the three-dimensional resonant cells 104 should be less than about one-fifth of the wavelength, with better negative behaviors being exhibited when the three-dimensional resonant cells 104 are sized one-tenth or one-twentieth of the operating wavelength or smaller. For this example, each of the base 114 and sidewalls 106, 108, 110, and 112 may be square in shape with a size of 10 μm on a side. The material for the substrate 102, as well as for each of the sidewall substrates 107 and 109, is preferably translucent to electromagnetic radiation at the operating wavelength, and for this example may comprise silicon. Other suitable materials may include III-V semiconductor materials, II-VI semiconductor materials, and polymers.

Each of the square slotted-ring resonators 116, 118, and 120 preferably comprises a layer of a highly conductive material such as gold. Other suitable highly conductive materials may include silver, copper, platinum, or aluminum. As described further infra, each of the square slotted-ring resonators 116, 118, and 120 further comprises a layer of magnetic material such as Permalloy, a nickel iron magnetic alloy that is also conductive, disposed on top of the highly conductive material layer and co-patterned therewith. The bendable joining elements 122 and 124 may comprise a ductile metal such as gold, aluminum, or copper. For one embodiment, the bendable joining elements 122 and 124 are implemented in a manner similar to that discussed in U.S. Pat. No. 6,922,127. For one embodiment, the bendable joining elements 122 and 124 can touch the conductor patterns on their respective sidewall substrates 109 and 107, with their shapes and conductivities being included as aspects of the electromagnetically reactive conductor patterns. It is to be appreciated that the above-listed materials and dimensions are presented by way of example only, and that a wide variety of other materials and dimensions are within the scope of the present teachings.

Figure 2:
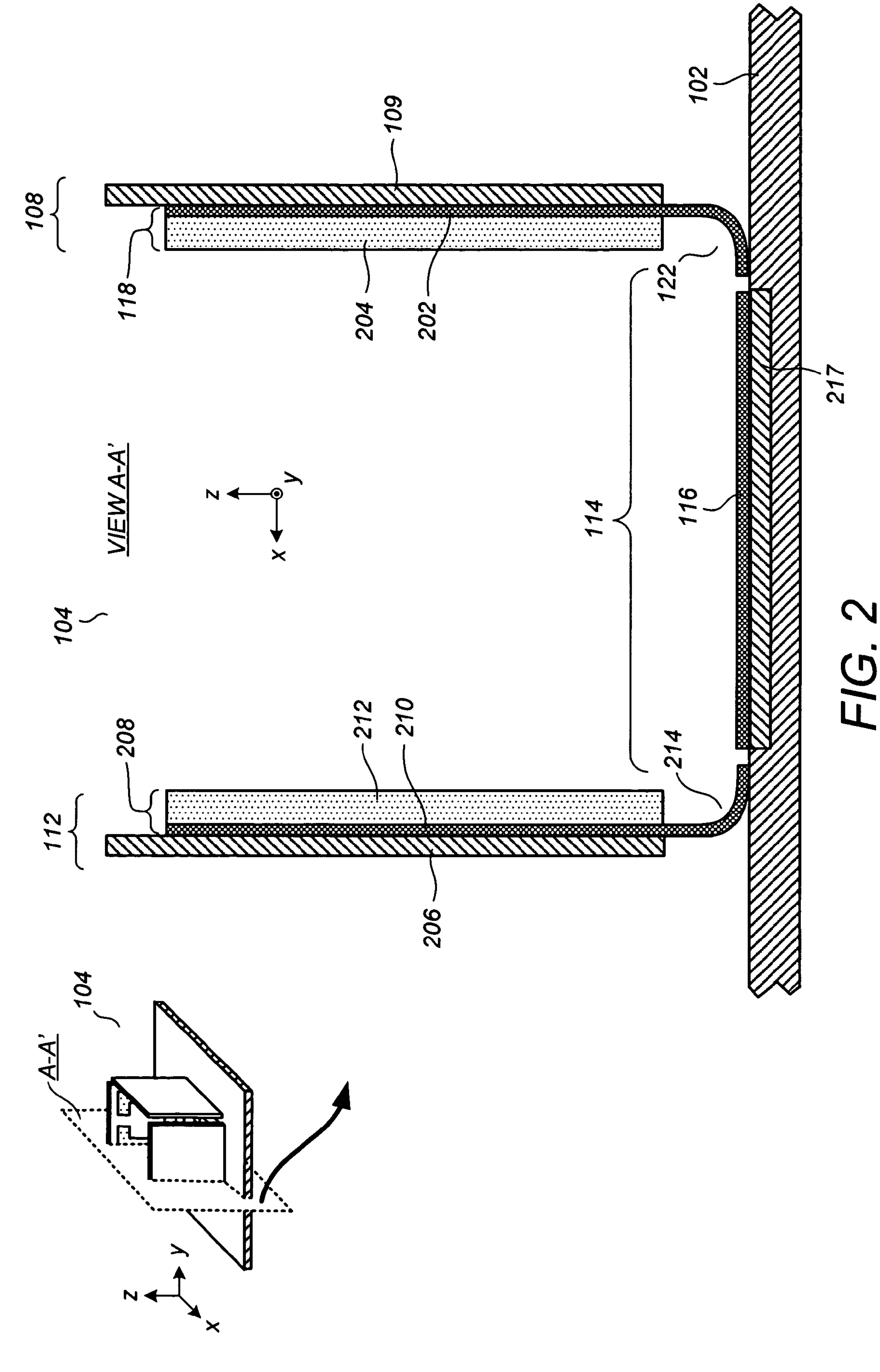
FIG. 2 illustrates a side cut-away view of a three-dimensional resonant cell according to an embodiment.

FIG. 2 illustrates a side cut-away view of the three-dimensional resonant cell 104 along a cut plane A-A' parallel to the x-z axis and passing through the sidewalls 112 and 108. As illustrated in FIG. 2, sidewall 108 comprises the sidewall substrate 109 having the square slotted-ring resonator 118 thereon. As discussed supra, the square slotted-ring resonator 118 comprises a highly conductive layer 202 and a magnetic material layer 204. The magnetic material layer 204 is primarily an artifact of fabrication when magnetic tilt-up actuation is used, although it does provide some conductivity that contributes to the resonance conditions that lead to the negative effective permeability and/or negative effective permittivity behaviors. Also shown in FIG. 2 is the sidewall 112 comprising a sidewall substrate 206 and a square slotted-ring resonator 208 thereon, which in turn comprises a highly conductive layer 210 and a magnetic material layer 212.

According to an embodiment, because the sidewall substrates 109 and 206 are each formed lithographically in a horizontal position, they can each comprise electrically active and/or optically active elements fabricated using any of a rich variety of known lithographic techniques. By way of example, sidewall substrates 109 and 206 may include an optically pumped gain material, as described further infra with respect to FIG. 7. For operational symmetry with the sidewalls 108 and 112, which in turn furthers the isotropy of the resultant overall composite material, the base 114 may optionally be provided with an underlying active region 217 having similar active functionalities as the sidewall substrates 109 and 206. Optionally, for further operational symmetry, a magnetic material layer (not shown) can be deposited above the square slotted-ring resonator 116 and co-patterned therewith, although such magnetic layer would not be needed for fabrication purposes.

Also shown in FIG. 2 is the bendable joining element 122 connecting the sidewall 108 to the base 114/substrate 102, as well as a corresponding bendable joining element 214 connecting the sidewall 112 to the base 114/substrate 102. For the embodiment of FIG. 2, the bendable joining elements 122 and 214 are integral with the highly conductive layers 202 and 210, respectively, of the square slotted-ring resonators 118 and 208, respectively. In other embodiments the bendable joining elements 122 and 214 can be electrically isolated.

Figure 3B:
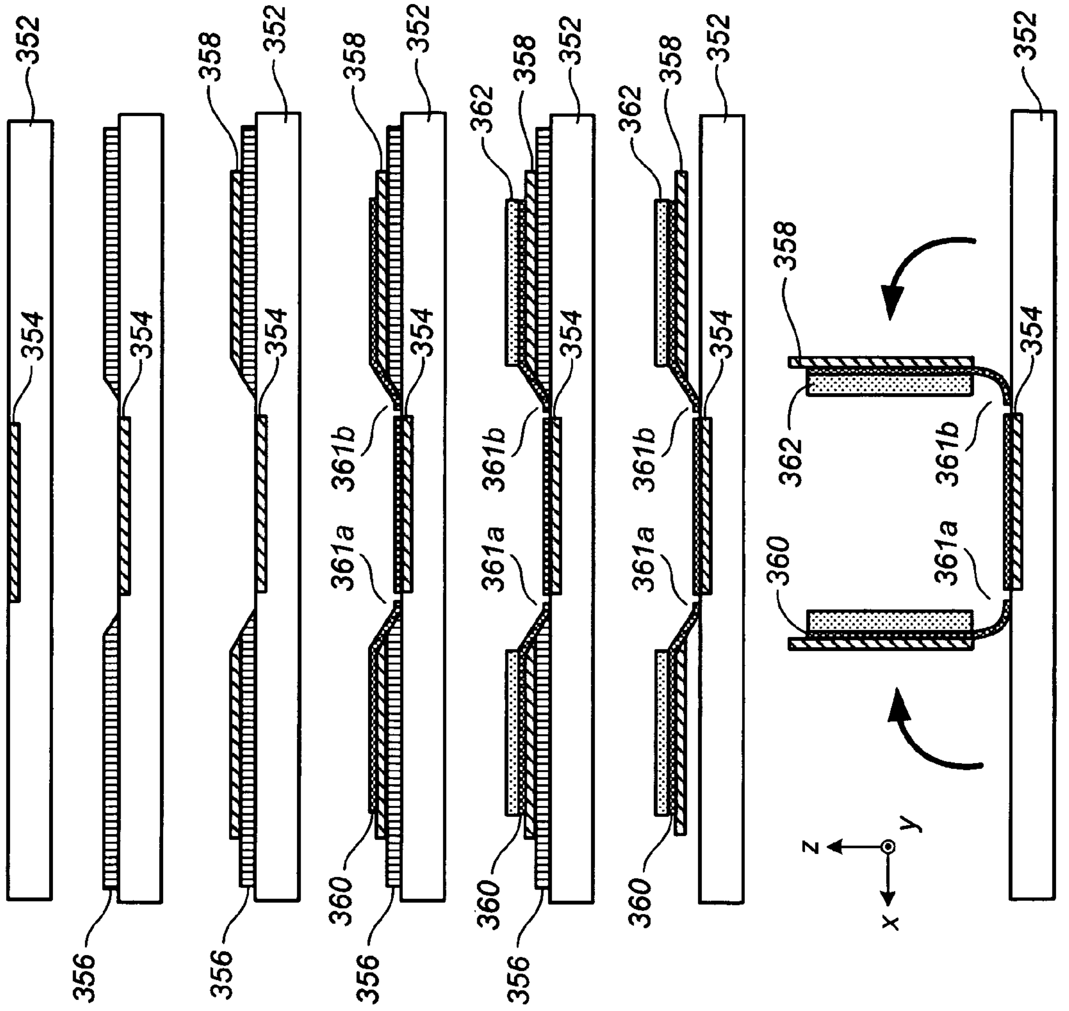
FIGS. 3A-3B illustrate fabricating a composite material according to an embodiment.
Figure 3A:
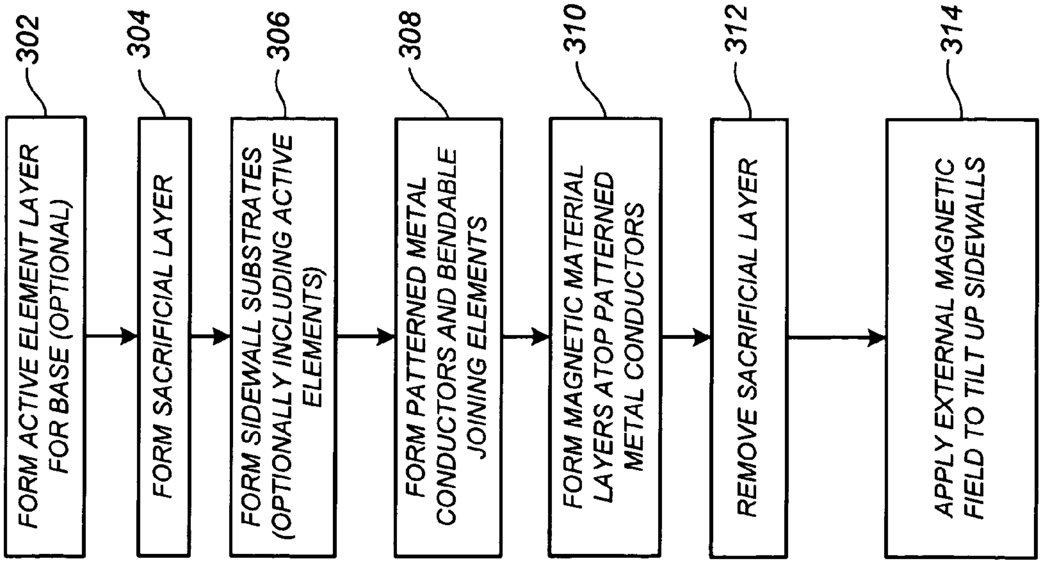

FIGS. 3A-3B illustrate steps for fabricating a composite material according to an embodiment and associated cutaway side views of a substrate 352 as a three-dimensional resonant cell is being fabricated thereon. At step 302, an optional active element layer 354 is formed in the substrate 352 at a location that will correspond to the base of the three-dimensional resonant cell. For example, the optional active element layer 354 may be provided with an optical gain material if the sidewall substrates of the three-dimensional resonant cell are also going to be provided with the optical gain material. At step 304, a sacrificial layer 356 is formed as shown. The sacrificial layer 356 comprises a material such as silicon oxide that etches far more readily than the surrounding materials.

At step 306, layer(s) 358 is (are) formed corresponding to the sidewall substrates of the three-dimensional resonant cell. As discussed supra, the layer(s) 358 can optionally comprise electrically active and/or optically active elements. At step 308, a highly conductive layer 360 is deposited and patterned according to an electromagnetically reactive conductor pattern, such as a square slotted-ring resonator pattern. With this step, or in a separate step, the bendable joining regions of the three-dimensional resonant cell are formed, each extending from an edge of the sidewall substrates in layer(s) 358 to an anchor location at the substrate, such anchoring locations being shown as 361*a* and 361*b* in FIG. 3B. For the particular embodiment of FIGS. 3A-3B, the bendable joining regions are integral with the highly conductive layer 360 of the ring resonator patterns.

At step 310, a magnetic material layer 362 is deposited above the highly conductive layer 360 and co-patterned therewith in the electromagnetically reactive conductor pattern. By way of example, where the magnetic material layer 362 comprises Permalloy and the highly conductive layer 360 comprises gold, the Permalloy may be electroplated onto the gold. At step 312 the sacrificial layer is removed using, for example, a hydrogen fluoride etchant, after which the sidewall substrates (layer(s) 358) are horizontally suspended in space above the substrate 352. Finally, at step 314, the sidewall substrates (layer(s) 358) are tilted up by application of an external magnetic field.

Step 314 may comprise tilting the sidewalls up simultaneously using a single applied magnetic field, or may alternatively comprise tilting up different sidewalls at different times, depending on the particular geometry desired and materials used. For one embodiment, the intrinsic magnetic field of the magnetic material layers 362 is parallel to the substrate, or caused to be parallel to the substrate, upon formation. To tilt up the sidewall substrates, a strong vertical magnetic field is applied and the sidewall substrates are simultaneously tilted up to a vertical position as the intrinsic magnetic fields of align with the vertical magnetic field. For other embodiments in which different sidewalls are tilted up at different times, various known locking mechanisms can be incorporated to ensure that earlier-raised sidewall substrates remain properly raised as subsequent sidewall substrates are raised.

Figure 4A:
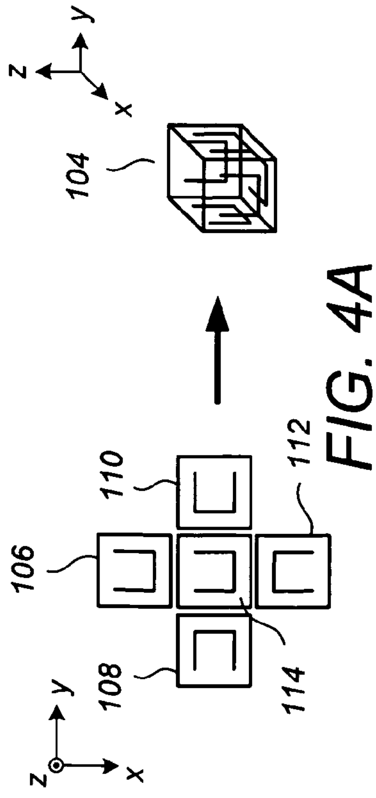
FIGS. 4A-4C illustrate top views of substrates during composite material fabrication and perspective views of three-dimensional resonant cells according to one or more embodiments.
Figure 4B:
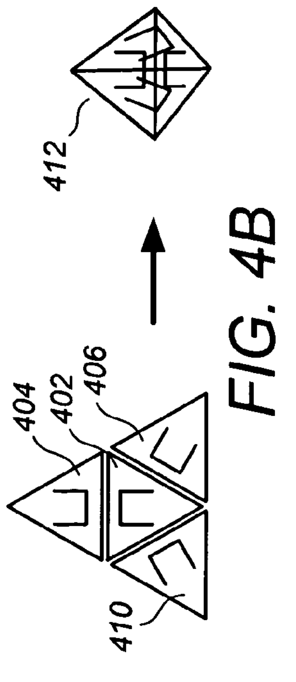
Figure 4C:
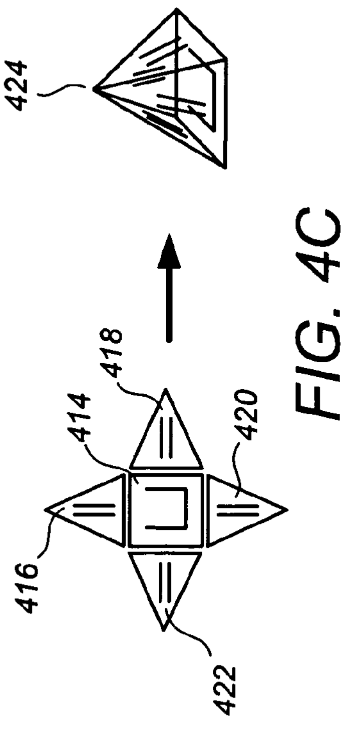

FIGS. 4A-4C illustrate top views of exemplary substrates during composite material fabrication and perspective views of three-dimensional resonant cells formed therefrom according to one or more embodiments. FIG. 4A illustrates a top view of a substrate patterned to result in the laterally closed, open-topped, four-sidewall three-dimensional resonant cell 104 of FIGS. 1A-1C, comprising the square base 114 and square sidewall patterns 106, 108, 110, and 112 as previously described, with a minor exception that a U-shaped conductor pattern is used instead of a square slotted-ring conductor pattern. Although omitted from the drawings herein for clarity, bendable joining elements are provided as necessary for each of the sidewall substrates.

In another embodiment (not shown), three vertical (90-degree) rectangular sidewalls are symmetrically arranged around a triangular base to form a laterally closed, open-topped, three-sidewall three-dimensional resonant cell. In another embodiment (not shown), five vertical (90-degree) rectangular sidewalls are symmetrically arranged around a pentagonal base to form a laterally closed, open-topped, five-sidewall three-dimensional resonant cell. In still other embodiments, "N" vertical (90-degree) rectangular sidewalls, $N \geqq 6$, are symmetrically arranged around an N-sided base to form a laterally closed, open-topped, N-sidewall three-dimensional resonant cell.

FIG. 4B illustrates a top view of an exemplary substrate patterned with triangular sidewalls 404, 406, and 410 symmetrically arranged around a triangular base, the triangular sidewalls 404, 406, and 410 each being upwardly tilted to an obtuse tetrahedral angle to form a vertically and laterally closed tetrahedral three-dimensional resonant cell 412. FIG. 4C illustrates a top view of an exemplary substrate patterned with triangular sidewalls 416, 418, 420, and 422 symmetrically arranged around a square base 414, the triangular sidewalls 416, 418, 420, and 422 each being upwardly tilted to an obtuse angle past ninety degrees to form a vertically and laterally closed pyramidal three-dimensional resonant cell 424. As illustrated in FIG. 4C, the conductive patterns on the sidewalls and base can be different from each other without departing from the scope of the present teachings.

Figure 5:
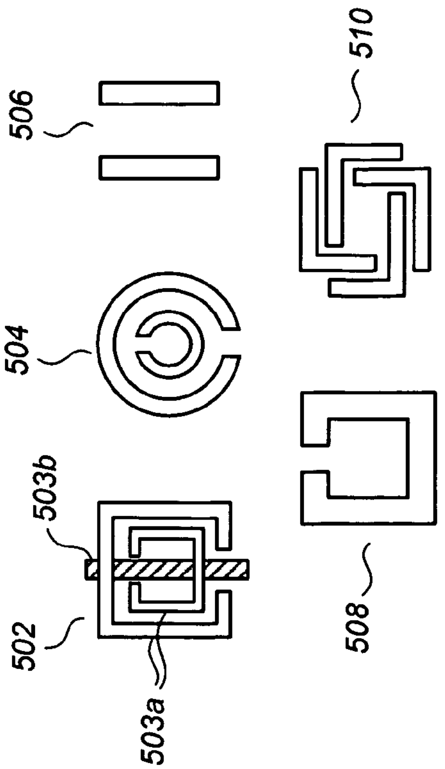
FIG. 5 illustrates examples of electromagnetically reactive conductor patterns according to one or more embodiments.

FIG. 5 illustrates some of the many different electromagnetically reactive conductor patterns (two-dimensional resonant cells) that may be formed on the sidewall substrates of a three-dimensional resonant cell of a composite material in accordance with one or more embodiments. The two-dimensional resonant cell 502 comprises a square split-ring resonator structure 503*a* together with a linear conductor element 503*b*, the linear conductor 503*b* facilitating achievement of a negative effective permittivity near a resonant frequency. The two-dimensional resonant cell 504 comprises a circular split-ring resonator, the two-dimensional resonant cell 506 comprises a parallel nanowire/bar resonator, the two-dimensional resonant cell 508 comprises a square open ring resonator, and the two-dimensional resonant cell 510 comprises a quartet of rotated L-shaped conductors. It is to be appreciated that any of a variety of other types of electromagnetically reactive conductor patterns are also within the scope of the present teachings including, but not limited to, various resonant antenna patterns and metal/dielectric/metal stack fishnet structures.

Figure 6:
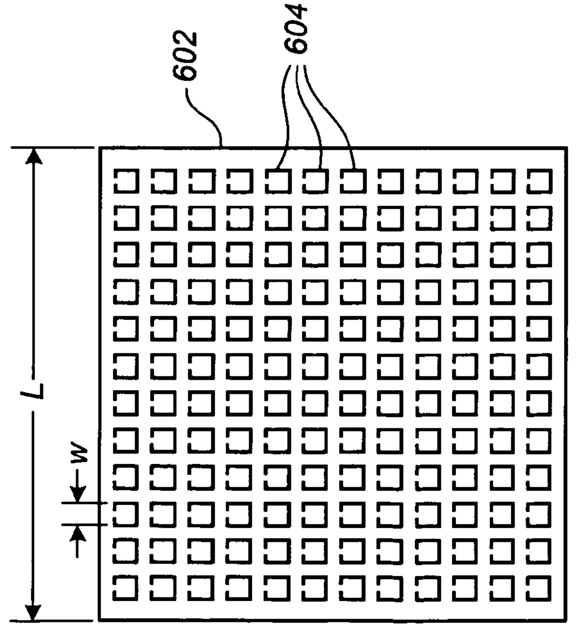
FIG. 6 illustrates a sidewall substrate of a three-dimensional resonant cell according to an embodiment.

FIG. 6 illustrates a sidewall substrate 602 that may be incorporated into a three-dimensional resonant cell of a composite material according to an embodiment. Generally speaking, the above-described tilt-up methods might begin to experience practical difficulties as the size of the sidewall substrates shrink below the order of 10 μm. According to an embodiment, sidewall substrate 602 comprises a plurality of two-dimensional resonant cells 604 distributed thereacross, wherein a dimension "w" for each two-dimensional resonant cell 604 is relatively small compared to the operational wavelength, such as one-fifth, one-tenth, or one-twentieth of that operational wavelength or smaller, but wherein the sidewall substrate 602 has a major dimension "L" greater than about one-fifth the wavelength. This is particularly advantageous for smaller wavelengths such as those in the infrared and optical regimes. For such operational wavelengths, the two-dimensional resonant cells 604 provide a resonance behavior facilitating the desired negative effective permittivity and/or negative effective permeability, while the multiple directionalities provided by the sidewalls and base are still at a fine enough level to provide improved isotropy of response.

For one embodiment, the plurality of two-dimensional resonant cells 604 are less than one-fifth of the operational wavelength, whereas the sidewall substrate 602 has a major dimension greater than one wavelength. For another embodiment, the plurality of two-dimensional resonant cells 604 are less than one-hundredth of the operational wavelength, whereas the sidewall substrate 602 has a major dimension greater than one wavelength. Especially in view of known nanoimprint lithography methods which can make the two-dimensional resonant cell size "w" very small, for example on the order of hundreds or even tens of nanometers, negative effective permittivity and/or negative effective permeability can be provided even for wavelengths in the near-infrared and optical regimes while maintaining a good degree of isotropy of response. For one embodiment, the major dimension "L" of the sidewall substrate 602 is greater than about 10 μm, while the major dimension "w" of the two-dimensional electromagnetically reactive cells 604 is less than about 300 nm.

Figure 7:
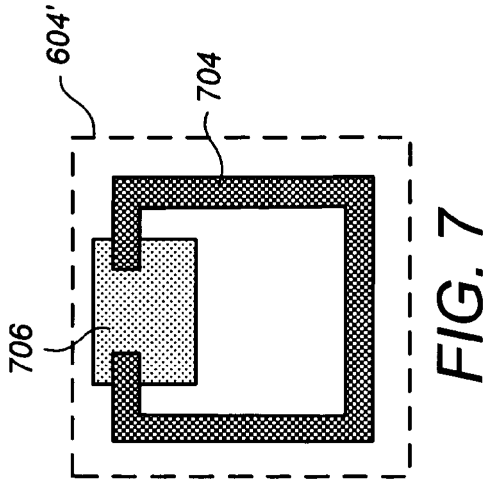
FIG. 7 illustrates a two-dimensional resonant cell for the sidewall substrate of FIG. 6.

FIG. 7 illustrates a two-dimensional resonant cell 604' that may be used in conjunction with a three-dimensional resonant cell that includes the sidewall substrate 602 according to an embodiment. The two-dimensional resonant cell 604' comprises a square slotted-ring conductor 704 and an optical gain medium 706. The optical gain medium 706 is optically pumped from an external pump source (not shown) and has an amplification band that includes the wavelength of operation for which the negative effective permeability and/or negative effective permittivity is desired.

The optical gain medium 706 may be integrated into the sidewall substrate 602 near the two-dimensional resonant cell 604'. By way of example and not by way of limitation, where the desired operational wavelength is in the WDM wavelength range near 1500 μm, the optical gain medium 706 can comprise bulk active InGaAsP and/or multiple quantum wells according to a InGaAsP/InGaAs/InP material system. In the latter case, the sidewall substrate 602 can comprise a top layer of p-InP material 100 nm thick, a bottom layer of n-InP material 100 nm thick, and a vertical stack therebetween comprising 5-12 (or more) repetitions of undoped InGaAsP 6 nm thick on top of undoped InGaAs 7 nm thick. In other embodiments, the electromagnetically reactive cell 604' can be similar to those described in the commonly assigned US 2006/0044212A1, which is incorporated by reference herein.

Figure 8:
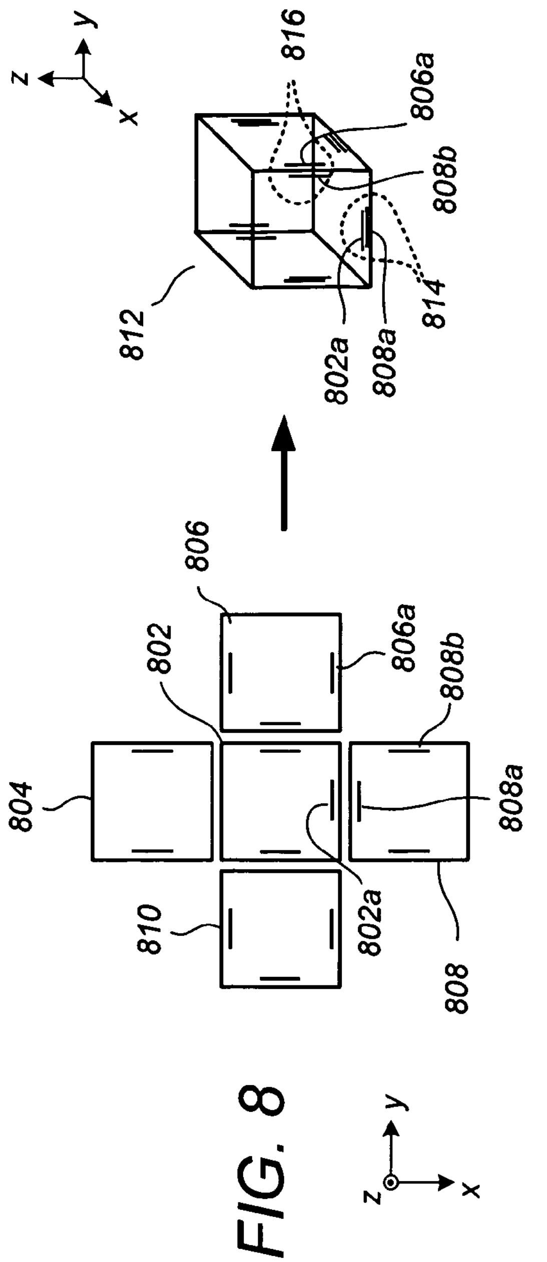
FIG. 8 illustrates a top view of a substrate during composite material fabrication and a perspective view of a three-dimensional resonant cell according to an embodiment.

FIG. 8 illustrates a top view of a substrate during composite material fabrication and a perspective view of a three-dimensional resonant cell 812 according to an embodiment. Patterned on the substrate are a base 802 and a plurality of sidewall substrates 804, 806, 808, and 810. According to an embodiment, each of the sidewall substrates 804, 806, 808, and 810 is patterned with at least one single conductor that represents a portion of a multi-conductor resonant structure but that does not form a multi-conductor resonant structure in conjunction with the other single conductors on the same sidewall substrate. By way of example, the sidewall substrate 806 comprises a first wire 806*a* that is not close enough to other wires on the sidewall substrate 806 to form a multi-conductor resonant structure. Likewise, the sidewall substrate 808 comprises a second wire 808*b* that is not close enough to other wires on the sidewall substrate 808 to form a multi-conductor resonant structure.

However, according to an embodiment, the conductor patterns are designed such that at least one complete multi-conductor resonant structure is formed in the three-dimensional resonant cell, when fabricated, by pairings of single conductors from different sidewall substrates. Thus, by way of example, upon formation of the three-dimensional resonant cell 812, the first wire 806*a* and the second wire 808*b* are brought in sufficiently close proximity to form a multi-conductor resonant structure 816. A second example is also provided in FIG. 8, wherein a third wire 802*a* on the base 802 and a fourth wire 808*a* on the sidewall substrate 808 are brought in sufficiently close proximity to form a multi-conductor resonant structure 814. Notably, the newly formed multi-conductor resonant structures 814 and 816 are oriented along different planes than any of the individual sidewall substrates 804, 806, 808, and 810. Thus, a rich variety of possibilities for different resonating directionalities are provided for further enhancing isotropy of response. In other embodiments, conductors from opposing sidewall substrates can form such multi-conductor resonant structures. For example, the sidewall substrate 806 may be patterned with a larger circular split ring while the sidewall substrate 808 may be patterned with a smaller circular split ring, such that upon formation of the three-dimensional resonant cell, a type of split-ring resonator structure is formed.

Advantageously, a composite material comprising a plurality of three-dimensional resonant cells according to one or more of the embodiments provides enhanced isotropy of response when compared to composite materials comprising only flat, planar arrangements of two-dimensional resonant cells, and yet is also amenable to large-scale fabrication and is adaptable for a variety of different wavelengths in the microwave, infrared, and even optical regimes. Moreover, because the sidewall substrates of the three-dimensional resonant cells are lithographically patterned, a rich variety of different passive and/or active structures can be incorporated into the sidewall substrates, such as externally powered gain structures for providing gain to the propagating optical signal.

Whereas many alterations and modifications of the embodiments will no doubt become apparent to a person of ordinary skill in the art after having read the foregoing description, it is to be understood that the particular embodiments shown and described by way of illustration are in no way intended to be considered limiting. By way of example, although the tilting up of the sidewall substrates is described supra as being achieved by deposition of a magnetic layer thereon and application of an external magnetic field, any of a variety of other en masse or large scale tilt-up methods can be used that likewise do not require manual intervention or space-intensive on-chip mechanical actuators without departing from the scope of the present teachings. For example, within the scope of the present teachings is an alternative fabrication method in which small photoresist or solder bumps are placed along one edge of a surface and heat is applied sufficient to melt the photoresist or solder bumps, whereby the surface tilts upwards. In still other embodiments, other methods known in the microelectromechanical systems (MEMS) arts, such methods based on induced surface tensions, can be used. Thus, reference to the details of the described embodiments are not intended to limit their scope.

What is claimed is:

1. A composite material for providing at least one of a negative effective permeability and a negative effective permittivity for incident radiation of at least one wavelength, said composite material comprising:

a plurality of three-dimensional resonant cells disposed across a first substrate, each three-dimensional resonant cell comprising a base substantially parallel to said first substrate and at least three sidewalls upwardly extending therefrom, said base having a resonator patterned thereon and each upwardly extending sidewall comprising a sidewall substrate having a resonator patterned thereon, and a plurality of bendable joining elements, one or more of the bendable joining elements connecting each sidewall to said first substrate.

2. The composite material of claim 1, wherein said base and said at least three sidewalls of said three-dimensional resonant cells each have a major dimension less than one-fifth of said wavelength.

3. The composite material of claim 2, wherein said sidewalls extend upward at approximately 90 degrees from said first substrate, and wherein each of said three-dimensional resonant cells comprises one of four, five, or six such sidewalls substantially identical to each other and positioned symmetrically around said base.

4. The composite material of claim 2, wherein said sidewall substrates are triangular in shape, and wherein each of said three-dimensional resonant cells comprises three such sidewalls positioned symmetrically around said base and extending upward at an obtuse angle to form a closed tetrahedron.

5. The composite material of claim 2, wherein said sidewall substrates are triangular in shape, and wherein each of said three-dimensional resonant cells comprises four such sidewalls positioned symmetrically around said base and extending upward at an obtuse angle to form a closed pyramid.

6. The composite material of claim 2, wherein each of said sidewalls further comprises an optical gain medium for each of said three-dimensional resonant cells, the optical gain medium configured to provide gain at the wavelength of the incident radiation.

7. The composite material of claim 2, further comprising at least one additional substrate having a substantially identical plurality of three-dimensional resonant cells as said first substrate and being stacked vertically above said first substrate.

8. The composite material of claim 2, wherein said resonator pattern on each of said sidewall substrates comprises a portion of a multi-conductor resonant structure, and wherein at least one complete multi-conductor resonant structure is formed in said three-dimensional resonant cell by proximal ones of said portions of multi-conductor resonant structures.

9. The composite material of claim 1, wherein said at least three sidewalls of said three-dimensional resonant cells each have a major dimension of at least one wavelength, and wherein each of said sidewall substrates comprises a plurality of two-dimensional electromagnetically reactive cells having a major dimensions less than one-fifth of said wavelength.

10. The composite material of claim 9, wherein said major dimension of said at least three sidewalls is greater than about 10 μm, wherein said major dimensions of said two-dimensional electromagnetically reactive cells is less than about 300 nm, and wherein said at least one wavelength lies in one of an infrared and an optical wavelength range.

11. The composite material of claim 1, wherein said bendable joining element is ductile.

12. The composite material of claim 1, wherein said bendable joining element is a highly conductive layer of said resonator patterned on said sidewall substrate, said highly conductive layer disposed on said sidewall substrate and connecting said sidewall substrate to said first substrate.

13. The composite material of claim 1, wherein said resonator patterned on said base further comprises a highly conductive layer disposed on said base and a magnetic material layer disposed on said highly conductive layer.

14. The composite material of claim 1, wherein said resonator patterned on said said sidewall substrate further comprises a highly conductive layer disposed on said sidewall substrate and a magnetic material layer disposed on at least a portion of said highly conductive layer.

* * * * *